(12) United States Patent
Okazaki et al.

(10) Patent No.: US 8,022,310 B2
(45) Date of Patent: Sep. 20, 2011

(54) MULTILAYER WIRING BOARD

(75) Inventors: Toru Okazaki, Osaka (JP); Hideo Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 643 days.

(21) Appl. No.: 12/193,311

(22) Filed: Aug. 18, 2008

(65) Prior Publication Data

US 2009/0052835 A1 Feb. 26, 2009

(30) Foreign Application Priority Data

Aug. 23, 2007 (JP) ................................. 2007-217041
Apr. 18, 2008 (JP) ................................. 2008-108890

(51) Int. Cl.
*H05K 1/03* (2006.01)
(52) U.S. Cl. .......... 174/255; 174/250; 174/256; 29/829; 29/846
(58) Field of Classification Search .................. 174/250, 174/255, 256, 258; 29/825, 829, 831, 846
See application file for complete search history.

(56) References Cited

U.S. PATENT DOCUMENTS

| | | | | | |
|---|---|---|---|---|---|
| 3,347,724 | A | * | 10/1967 | Schneble, Jr. et al. | 156/151 |
| 4,327,143 | A | * | 4/1982 | Alvino et al. | 442/180 |
| 4,477,512 | A | * | 10/1984 | Thomas et al. | 442/180 |
| 5,912,654 | A | * | 6/1999 | Ouchi et al. | 345/98 |
| 6,994,896 | B2 | * | 2/2006 | Sethumadhavan et al. | 428/1.6 |
| 7,227,179 | B2 | * | 6/2007 | St. Lawrence et al. | 257/40 |
| 2009/0218672 | A1 | * | 9/2009 | Nakamura et al. | 257/690 |
| 2009/0265028 | A1 | * | 10/2009 | Sri-Jayantha et al. | 700/121 |
| 2010/0051327 | A1 | * | 3/2010 | Ogatsu | 174/254 |
| 2010/0116530 | A1 | * | 5/2010 | Okazaki | 174/257 |
| 2010/0294554 | A1 | * | 11/2010 | Okazaki | 174/261 |

FOREIGN PATENT DOCUMENTS

JP 2000-151035 5/2000

OTHER PUBLICATIONS

Partial translation of JPCA Standard-Build-up Wiring Board (JPCA-BU01).

\* cited by examiner

*Primary Examiner* — Robert J Hoffberg
(74) *Attorney, Agent, or Firm* — McDermott Will & Emery LLP

(57) ABSTRACT

The present invention provides a multilayer wiring board in which warpage during reflow soldering can be reduced even if there is no sufficient space for disposing a dummy pattern or if a dummy pattern cannot be disposed. A difference between the ratios of copper remaining in wiring layers causes a difference between the amounts of thermal expansion of the wiring layers. The fiber bundle content of at least one resin base material layer is made different from that of the other resin base material layers, to cause a difference between the amounts of thermal expansion of the resin base material layers. This difference between the amounts of thermal expansion of the resin base material layers is used to cancel the difference between the amounts of thermal expansion of the wiring layers. Thus, warpage of the board during reflow soldering is reduced.

7 Claims, 7 Drawing Sheets

(Amount of warpage: 1.21mm)

(Amount of warpage: 0.84mm)

(Amount of warpage: 1.3mm)

(Amount of warpage: 1.19mm)

PRIOR ART (Amount of warpage: 1.51mm)

PRIOR ART

MULTILAYER WIRING BOARD

BACKGROUND OF THE INVENTION

The present invention relates to a multilayer wiring board having a build-up structure comprising two or more wiring layers.

Multilayer wiring boards having a build-up structure are wiring boards that have been developed for the purpose of realizing high-density mounting of various electronic components. These multilayer wiring boards having a build-up structure are configured such that a plurality of wiring layers constituted by copper wires and resins and a plurality of resin base material layers constituted by resins and fiber bundles are alternately layered, and used for various digital devices and mobile devices.

First, a commonly used multilayer wiring board having a build-up structure will be described. FIG. 11 shows a partial cross section of a multilayer wiring board 100g (hereinafter, may be simply referred to as a "board") having a build-up structure. In the board 100g, $n$ ($n$ is an integer of or more) wiring layers (C1 to Cn) and (n−1) resin base material layers [B1 to B(n−1)] are laminated in an alternately layered manner. Hereinafter, the wiring layers and the resin base material layers may be collectively referred to as "wiring layers C" and "resin base material layers B", respectively.

The wiring layers C are constituted by a copper wire 101 and an insulating resin 103. The resin base material layers B are constituted by a fiber bundle 102 in the form of a woven or nonwoven fabric and the insulating resin 103 with which the fiber bundle 102 is impregnated. FIG. 11 schematically shows a state in which the fiber bundle 102 is impregnated with the resin 103 as the resin base material layers B. The layers are similarly shown also in the following drawings.

As the fiber bundle 102, glass fibers or aramid fibers are usually used. Furthermore, as the insulating resin 103, thermosetting resins such as epoxy resins, phenol resins, polyimide, or BT resin are used.

Typically, the wiring layers C and the resin base material layers B are formed by alternately layering fiber bundles that have been impregnated with an insulating resin and copper foils in which a wiring pattern has been formed, and curing the resin with application of pressure and heat in this state. The resin 103 constituting the wiring layers C is formed by causing a part of the resin with which the fiber bundles have been impregnated to enter gaps in the wiring pattern, at the time of application of pressure and heat.

Although not shown, the wiring layers C are electrically connected via a via-hole or through-hole formed through the resin base material layers B. The configuration of the above-described multilayer wiring board having a build-up structure is defined in detail in the standard set by Japan Electronics Packaging and Circuits Association "JPCA standard: Build-up Printed Wiring Boards (Terms and Definitions, Test Methods and Design examples)" (see Design examples 3 and 4 in page 2).

The resin base material layers B are divided into a base layer 104 functioning as a central layer in the multilayer structure and build-up layers 105 laminated above and below the base layer 104, in a laminating press process in manufacture of boards. Resin base materials constituting the base layer 104 and the build-up layers 105 may be the same or different. As resin base materials for the layers of the build-up layers 105, a single material is used in which the fiber bundle content is constant.

In a reflow soldering process, the board 100g in which electronic components are temporarily fixed on its front and rear mounting faces is placed on a reflow belt or reflow pallet, and the temperature is raised from room temperature to 220° C. or more to perform soldering and then lowered to room temperature. At that time, in the board 100g, the ratio of copper remaining (the ratio of the area of copper wires occupied in the entire area of the wiring layers C) differs between the wiring layers. Accordingly, the amount of thermal expansion differs between the wiring layers, and thus warpage occurs. The mechanism how warpage of the board occurs will be specifically described with reference to FIG. 12.

A board 100h shown in FIG. 12 has six wiring layers C1 to C6 arranged in that order from above and five resin base material layers that are arranged between the wiring layers, the resin base material layers comprising layers B1 and B2 (both are the build-up layers 105), B3 (the base layer 104), and B4 and B5 (both are the build-up layers 105) arranged in that order from above. The ratio of copper remaining in the wiring layers is 32%, 28%, 37%, 46%, 52%, and 54% in that order starting with the wiring layer C1. In this case, regarding the average of the ratio of copper remaining in layers (C1 to C3) situated above the base layer 104 (the resin base material layer B3) and that in layers (C4 to C6) situated therebelow, the average of the ratio of copper remaining in the layers situated below the base layer 104 is larger.

Comparison between the copper wire 101 and the resin 103 constituting the wiring layers C shows that the coefficient of linear expansion of the resin 103 is larger than that of the copper wire 101. Thus, wiring layers with a large ratio of copper remaining have a small amount of thermal expansion under temperature load. Thus, in the board 100h shown in FIG. 12, the amount of thermal expansion of the layers situated above the base layer 104 is large, and that of the layers situated therebelow is small. Accordingly, under temperature load, the board is warped to protrude upward.

If electronic components are mounted in a state where the board is still warped due to the reflow soldering process, the reliability in connection between the electronic components and the board is considerably lowered, which is a significant factor to deteriorate the quality of an electronic circuit in which the multilayer wiring board is installed.

In order to prevent warpage of a board in the reflow soldering process, the countermeasure shown in Japanese Laid-Open Patent Publication No. 2000-151015 is conventionally adopted. That is to say, as shown in FIG. 11, in order to minimize a difference in the amount of thermal expansion resulting from a difference between the ratios of copper remaining in the wiring layers C, a dummy pattern 108 is formed in the wiring layers C in addition to the original copper wire 101 constituting the electronic circuit, thereby making the ratio of copper remaining in the wiring layers C as uniform as possible.

However, in a board for small electronic devices in which electronic circuits are required to be mounted at high density, the area occupied by lands for mounting electronic components increases, and thus a sufficient space for disposing a dummy pattern cannot be secured. Furthermore, if components operating at high frequency are mounted on a board, arrangement of a dummy pattern is restricted because a dummy pattern leads to generation of noise. Thus, in the conventional countermeasure in which a dummy pattern is provided, there are limits in reducing warpage of the board.

BRIEF SUMMARY OF THE INVENTION

It is therefore an object of the present invention to provide a multilayer wiring board in which warpage can be reduced even if there is no sufficient space for disposing a dummy pattern in wiring layers or if a dummy pattern cannot be disposed.

In order to achieve the above-described object, the present invention is directed to a multilayer wiring board comprising n (n is an integer of at least 4) wiring layers including an insulating resin and a wire made of a conductive material, and (n−1) resin base material layers including an insulating resin and a fiber bundle impregnated with said insulating resin, said wiring layers and resin base material layers being laminated in an alternately layered manner, wherein at least one of said (n−1) resin base material layers has a fiber bundle content different from that of the rest of said resin base material layers.

In the multilayer wiring board according to the present invention, the fiber bundle content of at least one resin base material layer is made different from that of the other resin base material layers, to cause a difference between the amounts of thermal expansion of the resin base material layers. More specifically, a difference between the amounts of thermal expansion of the resin base material layers is used to cancel a difference between the amounts of thermal expansion of the wiring layers, which is caused by a difference between the ratios of copper remaining in the wiring layers. Thus, warpage of boards due to reflow soldering can be reduced.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Hereinafter, a multilayer wiring board according to an embodiment of the present invention will be described with reference to drawings. Prior to the description of the configuration of the multilayer wiring board according to this embodiment, a principle for reducing warpage of a multilayer wiring board will be described.

Figure 1:
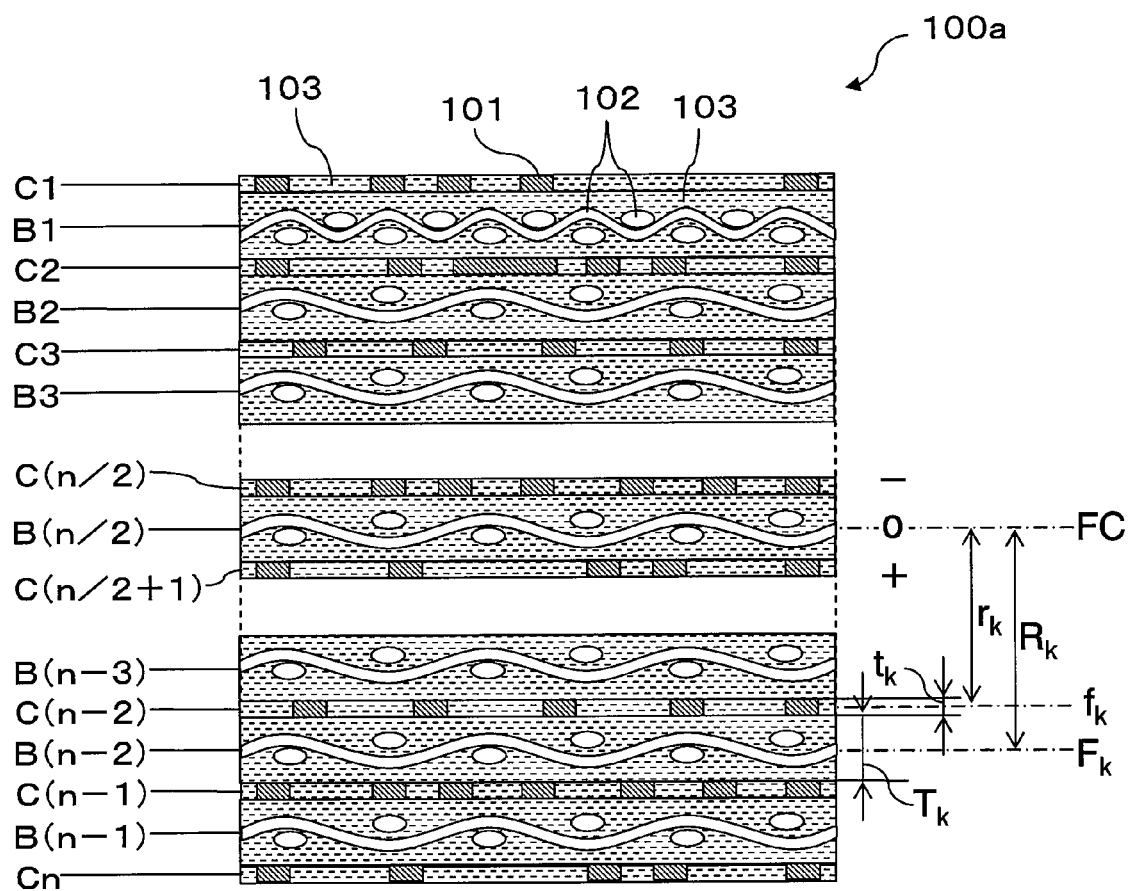
FIG. 1 is a cross-sectional view showing the configuration of a multilayer wiring board according to an embodiment of the present invention.
Figure 11:
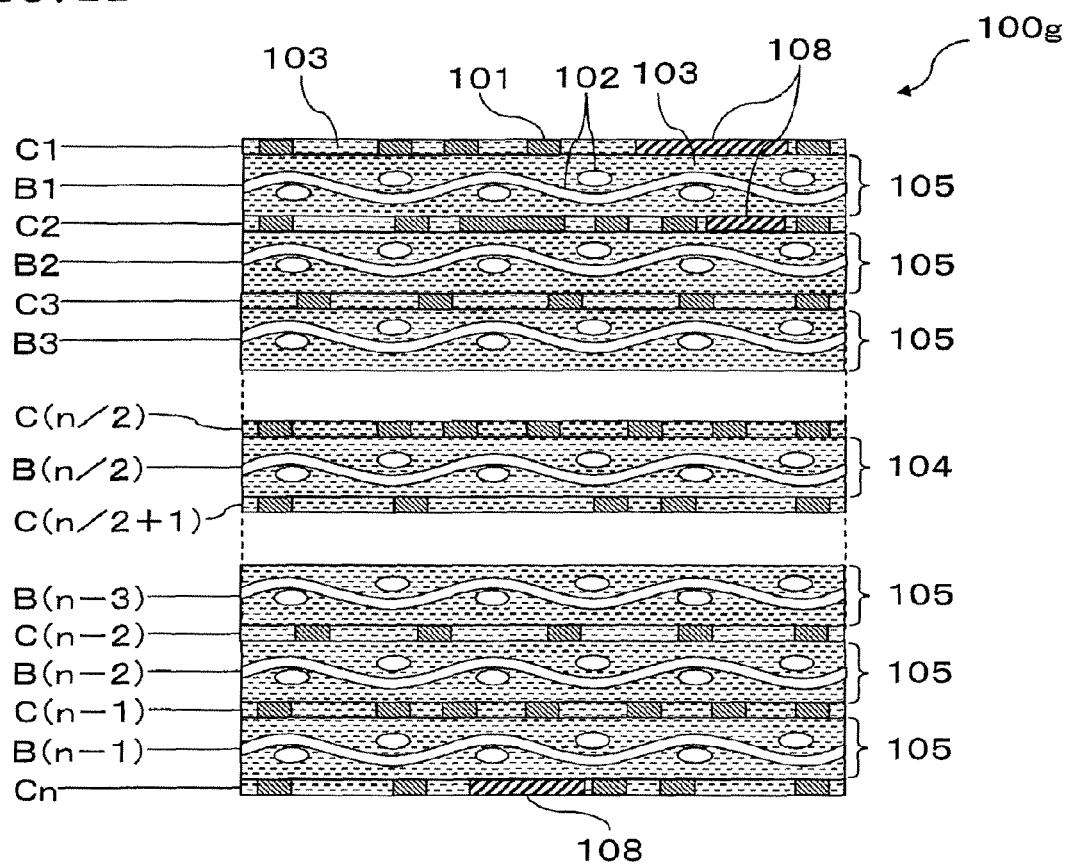
FIG. 11 is a cross-sectional view showing the basic configuration of a multilayer wiring board having a build-up structure.

FIG. 1 shows a partial cross section of a multilayer wiring board 100a according to the present invention. In the board 100a, n (n is an integer of 3 or more) wiring layers (C1 to Cn) and (n−1) resin base material layers [B1 to B(n−1)] are laminated in an alternately layered manner. Wiring layers C are constituted by a copper wire 101 and an insulating resin 103. Resin base material layers B are constituted by a fiber bundle 102 in the form of a woven or nonwoven fabric and the insulating resin 103 with which the fiber bundle 102 is impregnated. This configuration is similar to that of the board shown in FIG. 11, and the functions of the constituent elements are also the same. The same is applicable also to the following description.

In the multilayer wiring board according to the present invention, the fiber bundle content of at least one resin base material layer (B1 in FIG. 1) is made different from that of the other resin base material layers. The amount of thermal expansion of resin base material layers varies depending on the fiber bundle content. The amount of thermal expansion becomes smaller as the fiber bundle content becomes larger. Thus, with regulation of the fiber bundle content in each resin base material layer, a difference between the amounts of thermal expansion of the wiring layers, which is caused by a difference between the ratios of copper remaining in the wiring layers, can be canceled by a difference between the amounts of thermal expansion of the resin base material layers, which is caused by a difference in the fiber bundle content.

Hereinafter, a bending moment that causes warpage of a board under heat load that is typically represented by reflow soldering will be described. As shown in the right side of the cross-sectional view in FIG. 1, the thickness of a wiring layer that is the $k^{th}$ layer (the $k^{th}$ wiring layer) from one end face (the upper end face in FIG. 1) of the board 100a is taken as $t_k$ (mm), the distance from a midpoint FC in the lamination direction of the board 100a to a midpoint $f_k$ in the lamination direction of the $k^{th}$ wiring layer is taken as $r_k$ (mm), the thickness of a resin base material layer that is the $k^{th}$ layer (the $k^{th}$ resin base material layer) from one end face of the board 100a is taken as $T_k$ (mm), and the distance from the midpoint FC to a midpoint $F_k$ in the lamination direction of the $k^{th}$ resin base material layer is taken as $R_k$ (mm).

Formula (1) represents the bending moment of the multilayer wiring board 100a. The left side of Formula (1) represents the sum of the bending moments of the wiring layers (C1 to Cn) and the resin base material layers [B1 to B(n−1)] on a change in the unit temperature, and C on the right side represents a value determined based on the maximum amount of warpage that allows electronic components to be mounted on the board. The first term on the left side of Formula (1) represents the total sum of the bending moments of the wiring layers (C1 to Cn) on a change in the unit temperature. The second term on the left side represents the total sum of the bending moments of the resin base material layers [B1 to B(n−1)] on a change in the unit temperature. As shown in Formula (1), the bending moment of the multilayer wiring board 100a needs to be smaller than the value C.

Typically, a bending moment varies depending on the position or direction in a plane that is perpendicular to the direction in which wiring layers and resin base material layers are laminated. In this example, positional and directional factors are excluded from Formula (1) assuming that the characteristics of both the wiring layers and the resin base material layers are uniform in a plane that is perpendicular to the lamination direction.

$$\sum_{k=1}^{n} a_k e_k I_k r_k + \sum_{k=1}^{n-1} A_k E_k T_k R_k < C \quad (1)$$

In the first term on the left side of Formula (1), $a_k$ represents the coefficient of equivalent linear expansion of the $k^{th}$ wiring layer, and is given as Formula (2). Here, "coefficient of equivalent linear expansion" refers to a coefficient of linear expansion assuming that the wiring layers have uniform characteristics in a plane that is perpendicular to the lamination direction of the board.

$$a_k = \frac{e_{Cu} a_{Cu} V_{Cuk} + E_{PP} A_{PP}(1 - V_{Cuk})}{e_{Cu} V_{Cuk} + E_{PP}(1 - V_{Cuk})} \quad (2)$$

In the formula, $e_{Cu}$ represents the modulus of longitudinal elasticity of the copper wire, $a_{Cu}$ represents the coefficient of linear expansion of the copper wire, $V_{Cuk}$ represents the ratio of copper remaining in the $k^{th}$ wiring layer, $E_{PP}$ represents the modulus of longitudinal elasticity of the resin, and $A_{PP}$ represents the coefficient of linear expansion of the resin.

In the first term on the left side of Formula (1), $e_k$ represents the modulus of equivalent longitudinal elasticity of the $k^{th}$ wiring layer, and is given as Formula (3). Here, "modulus of equivalent longitudinal elasticity" refers to a modulus of longitudinal elasticity assuming that the wiring layers have uniform characteristics in a plane that is perpendicular to the lamination direction of the board.

$$e_k = e_{Cu} V_{Cuk} + E_{PP}(1 - V_{Cuk}) \quad (3)$$

In the formula, as in Formula (2), $e_{Cu}$ represents the modulus of longitudinal elasticity of the copper wire, $V_{Cuk}$ represents the ratio of copper remaining in the $k^{th}$ wiring layer, and $E_{PP}$ represents the modulus of longitudinal elasticity of the resin.

In the second term on the left side of Formula (1), $A_k$ represents the coefficient of equivalent linear expansion of the $k^{th}$ resin base material layer, and is given as Formula (4). Here, "coefficient of equivalent linear expansion" refers to the same as that described in Formula (2).

$$A_k = \frac{E_F A_F V_{Fk} + E_{PP} A_{PP}(1 - V_{Fk})}{E_F V_{Fk} + E_{PP}(1 - V_{Fk})} \quad (4)$$

In the formula, $E_F$ represents the modulus of longitudinal elasticity of the fiber bundle, $A_F$ represents the coefficient of linear expansion of the fiber bundle, $V_{Fk}$ represents the fiber bundle content of the $k^{th}$ resin base material layer, $E_{PP}$ represents the modulus of longitudinal elasticity of the resin as in Formula (2), and $A_{PP}$ represents the coefficient of linear expansion of the resin as in Formula (2).

In the second term on the left side of Formula (1), $E_k$ represents the modulus of equivalent longitudinal elasticity of the $k^{th}$ resin base material layer, and is given as Formula (5). Here, "modulus of equivalent longitudinal elasticity" refers to the same as that described in Formula (3).

$$E_k = E_F V_{Fk} + E_{PP}(1 - V_{Fk}) \quad (5)$$

In the formula, as in Formula (4), $E_F$ represents the modulus of longitudinal elasticity of the fiber bundle, $V_{Fk}$ represents the fiber bundle content of the $k^{th}$ resin base material layer, and $E_{PP}$ represents the modulus of longitudinal elasticity of the resin.

In the present invention, a bending moment on a change in the unit temperature, which results from a difference between the ratios of copper remaining in the wiring layers (C1 to Cn), shown in the first term on the left side of Formula (1) is canceled by a bending moment on a change in the unit temperature, which results from a difference between the fiber bundle contents of the resin base material layers [B1 to B(n−1)], shown in the second term on the left side, and thus Formula (1) is satisfied.

The value C of Formula (1) is determined based on the value of warpage that is acceptable for the board. Furthermore, in Formulae (2) to (5), the modulus of longitudinal elasticity $e_{Cu}$ of the copper wire, the coefficient of linear expansion $a_{Cu}$ of the copper wire, the modulus of longitudinal elasticity $E_{PP}$ of the resin, the coefficient of linear expansion $A_{PP}$ of the resin, the modulus of longitudinal elasticity $E_F$ of the fiber bundle, and the coefficient of linear expansion $A_F$ of the fiber bundle are known values. The ratio of copper remaining $V_{Cuk}$ in the $k^{th}$ wiring layer can be extracted from board CAD (computer aided design).

More specifically, in Formulas (2) to (5), only the fiber bundle content $V_{Fk}$ can be changed. Thus, for example, if resin base material layers with a known fiber bundle content $V_{Fk}$ are used as all the resin base material layers [B1 to B(n−1)] except for the first layer B1 as shown in FIG. 1, the fiber bundle content of the first layer B1 satisfying Formula (1) is obtained.

Usually, in manufacture of boards, the amount of warpage is evaluated each time boards are manufactured by way of trial. If the amount of warpage is large, boards are redesigned, manufactured by way of trial, and evaluated in terms of the amount of warpage, in a repeated manner. However, if the configuration (specifically, the fiber bundle content) of resin base material layers satisfying Formula (1) is obtained based on design data of board CAD prior to manufacture of boards, it is not necessary to repeat trial manufacture of boards.

If a board is designed using Formula (1) in this manner, the total sum of the bending moments of the board can be reduced, without reducing the bending moment (i.e., the value of the first term on the left side of Formula (1)) of the wiring layers by changing the electric circuit design, and thus warpage of the board can be easily reduced.

Here, Formula (1) is based on the case in which the base layer 104 is present in the center of the board, that is, the case in which there are an even number of wiring layers. However, it will be appreciated that with a slight change in the contents of Formula (1), the principle for reducing warpage of a board described based on Formula (1) is applicable also to the case in which the base layer 104 is not present in the center of the board, that is, the case in which there are an odd number of wiring layers.

Figure 2:
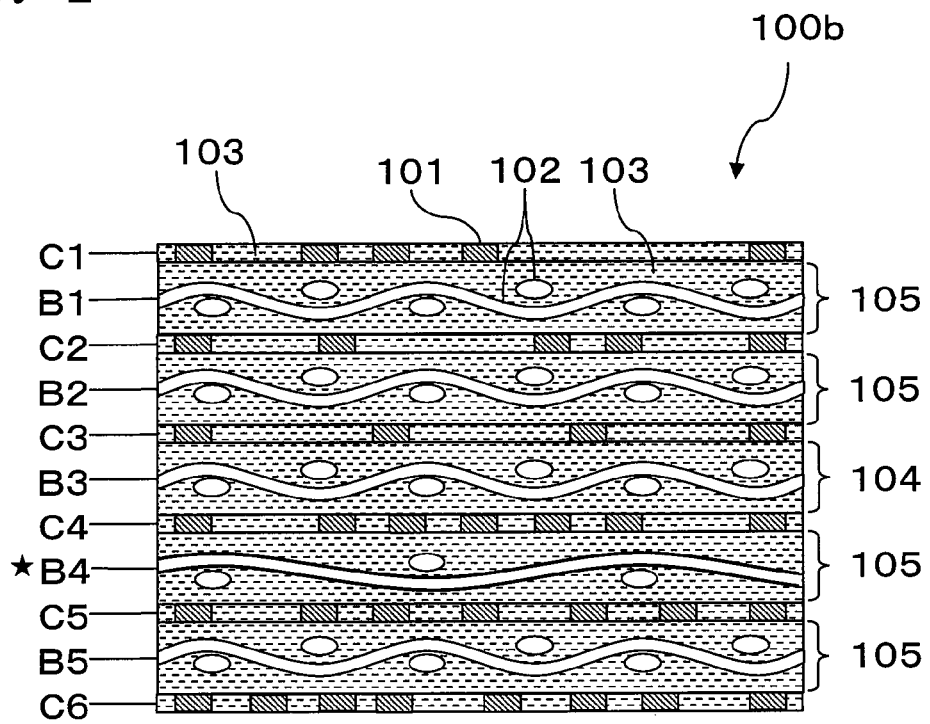
FIG. 2 is a cross-sectional view showing the configuration of another multilayer wiring board according to the embodiment of the present invention.

Next, the configuration of a multilayer wiring board satisfying the conditions in Formula (1) will be described using an exemplary board having six wiring layers and five resin base material layers. FIG. 2 shows the configuration of a multilayer wiring board 100b according to this embodiment. The board 100b has six wiring layers C1 to C6 arranged in that order from above and five resin base material layers that are arranged between the wiring layers, the resin base material layers comprising layers B1 and B2 (both are the build-up layers 105), B3 (the base layer 104), and B4 and B5 (both are the build-up layers 105) arranged in that order from above. The ratio of copper remaining in the wiring layers is 32%, 28%, 37%, 46%, 52%, and 54% in that order starting with the wiring layer C1. The ratio of copper remaining is extracted from the ratio of copper remaining in the wiring layers C contained in data of board CAD.

As described above, the ratio of copper remaining in the wiring layers in the board 100b is 32%, 28%, 37%, 46%, 52%, and 54% in that order starting with the wiring layer C1. Regarding the average of the ratio of copper remaining in the wiring layers (C1 to C3) situated above the base layer 104 and that in the wiring layers (C4 to C6) situated therebelow, the averages are respectively 32% and 51%, that is, the average of the ratio of copper remaining in the layers situated blow the base layer 104 is larger.

As described above, the amount of thermal expansion of the wiring layers C becomes smaller as the ratio of copper remaining becomes larger. Furthermore, the amount of thermal expansion of the resin base material layers B becomes smaller as the fiber bundle content becomes larger. Thus, it is possible to reduce warpage of the board 100b using either one of the following methods.

(1) In at least one of the build-up layers 105 (the resin base material layers B4 and B5) situated below the base layer 104, a resin base material layer having a smaller fiber bundle content than that of the other build-up layers 105 is used.

(2) In at least one of the build-up layers 105 (the resin base material layers B1 and B2) situated above the base layer 104, a resin base material layer having a larger fiber bundle content than that of the other build-up layers 105 is used.

In either one of the above-described methods, a force to warp the resin base material layers B to protrude downward can be generated against a force to warp the wiring layers C of the board to protrude upward, and thus both methods are effective for reducing warpage of the board.

In the above-described methods, warpage of the board 100b is reduced by combining two types of resin base material layers having different fiber bundle contents. Another method is also conceivable in which resin base material layers having fiber bundle contents that are different from one another are used. However, in that case, it is necessary to prepare a plurality of types of resin base material layers having different fiber bundle contents when manufacturing a board.

For example, in the case of fiber bundles in the form of a woven fabric, resin base material layers having different fiber bundle contents are manufactured by changing the interval between adjacent fibers or changing the thickness of fiber itself. However, manufacture of such fiber bundles having different intervals between fibers or different thicknesses of fiber significantly increases the cost for manufacturing the board, which is not preferable. Thus, it is realistic to prepare two types of resin base material layers having different fiber bundle contents, and combine the two types of resin base material layers according to the warpage level of the board, as described above.

Hereinafter, the configuration of the board 100b according to this embodiment will be specifically described. In this embodiment, among the five resin base material layers, base materials having a fiber bundle content of 75% are used for the layers B1, B2, B3, and B5, and a base material having a fiber bundle content of 63% is used only for the layer B4 (indicated by the symbol * in FIG. 2).

First, a method for manufacturing the board 100b will be described. Two types of resin base material layers having different fiber bundle contents were manufactured. Glass fiber having a cross section with a semimajor axis of 25 μm and a semiminor axis of 10 μm and knitted in the form of fabric was used as the fiber bundle, and an epoxy resin was used as the insulating resin. Two types of fiber bundles having different densities were manufactured, by changing the knitting interval of the fiber in manufacture of the fiber bundles.

Next, the thus manufactured fiber bundles in the form of fabric were impregnated with the resin, and thus two types of resin base material layers having different fiber bundle contents were produced. In production of resin base material layers having different fiber bundle contents, if a dye that does not affect the insulating properties or the like is added to the resin, thereby changing the color of one of the resin base material layers, the resin base material layers can be easily distinguished from each other. As a result, resin base material layers having different fiber bundle contents can be prevented from being arranged at wrong positions, which contributes to an improvement in the productivity.

Next, holes were formed by laser processing or the like at predetermined positions in the thus produced resin base material layer, and the holes were filled with a conductive resin composition in which a metal powder and a thermosetting resin were mixed, in order to form inner via-holes through the holes. Next, both faces of the resin base material layer were covered with two release films each of which had a wiring pattern formed on one face, and then heated in a pressed state to cause the resin to be cured and the wiring patterns to be fixed to the resin base material layer. Subsequently, the release films were removed from the resin base material layer. Here, a wiring pattern may be formed also by using a method in which both faces of the resin base material layer are covered with copper foils, and then etching is performed to form a wiring pattern.

A resin base material layer and a release film on which a wiring pattern was formed on one face were placed on the thus obtained first resin base material layer, inner via-holes were formed using a method as described above, and then pressure and heat was applied. The above-described process was repeated while laminating two types of resin base material layers having different fiber bundle contents in the order shown in FIG. 2, and thus the board 100b having five resin base material layers B and six wiring layers C was manufactured as a final product.

In the manufactured board 100b, the thickness of each of the wiring layers C was approximately 10 μm, and the thickness of each of the resin base material layers B was approximately 30 μm. The thus manufactured board 100b was cut to have a size of 50 mm×50 mm. Under a load of the maximum temperature 260° C. in a reflow process, the warpage of the board was 1.21 mm.

Figure 12:
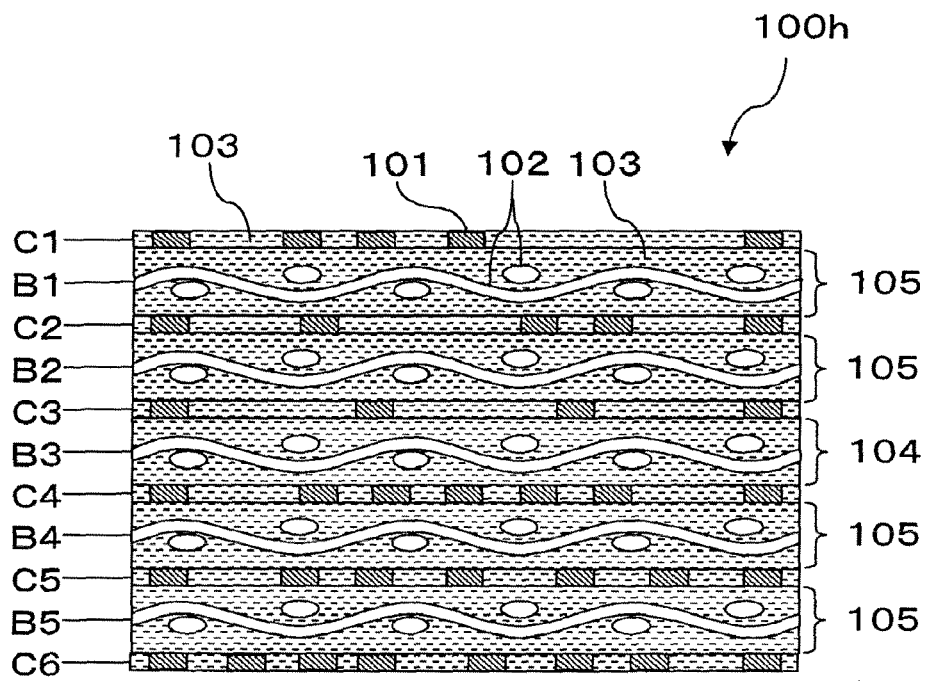
FIG. 12 is a cross-sectional view showing the configuration of a conventional multilayer wiring board.

As a comparative example, a board 100h having the configuration shown in FIG. 12 was manufactured using the same fiber bundle and resin as those of the board 100b, and cut to have a size of 50 mm×50 mm. The board 100b and the board 100h differ in that while the fiber bundle content of the resin base material layer B4 is 63% in the board 100b, it is 75% in the board 100h as in the other resin base material layers. Under a load of the maximum temperature 260° C. in a reflow process, the warpage of the board 100h was 1.51 mm.

Next, the warpage of a board will be described in a case where the fiber bundle content of one build-up layer (any one of the resin base material layers B1, B2, B4, and B5) of the four build-up layers 105 is changed. If it is attempted to actually manufacture a board in which the fiber bundle content of one resin base material layer is changed, a large amount of additional cost (several millions yen) is necessary. Thus, in the following description, an analytical model of a board is formed based on Formula (1) above, and a result obtained by simulating the warpage state using the analytical model is shown. Here, when forming the analytical model, parameters of the calculating formula are set so that values in the simulation result are substantially the same as the warpage values actually measured using the boards 100b and 100h <Warpage Simulation No. 1>

First, a simulation was performed using the configuration of the board 100b of this embodiment shown in FIG. 2, in which among the five resin base material layers, base materials having a fiber bundle content of 75% were used for the layers B1, B2, B3, and B5, and a base material having a fiber bundle content of 63% was used only for the layer B4. The ratio of copper remaining in the wiring layers is 32%, 28%, 37%, 46%, 52%, and 54% in that order starting with the wiring layer C1. The thickness of each of the wiring layers C is 10 μm, and the thickness of each of the resin base material layers B is 30 μm. The size of the board is 50 mm×50 mm.

In this warpage simulation, the physical properties of constituent elements of the board are as follows. The copper wire 101 has a modulus of longitudinal elasticity of 50000 (MPa) and a coefficient of linear expansion of $17\times10^{-6}$ (1/° C.). The resin 103 has a modulus of longitudinal elasticity of 8000 (MPa) and a coefficient of linear expansion of $60\times10^{-6}$ (1/° C.). The fiber bundle 102 has a modulus of longitudinal elasticity of 70000 (MPa) and a coefficient of linear expansion of $5\times10^{-6}$ (1/° C.).

Figure 3:
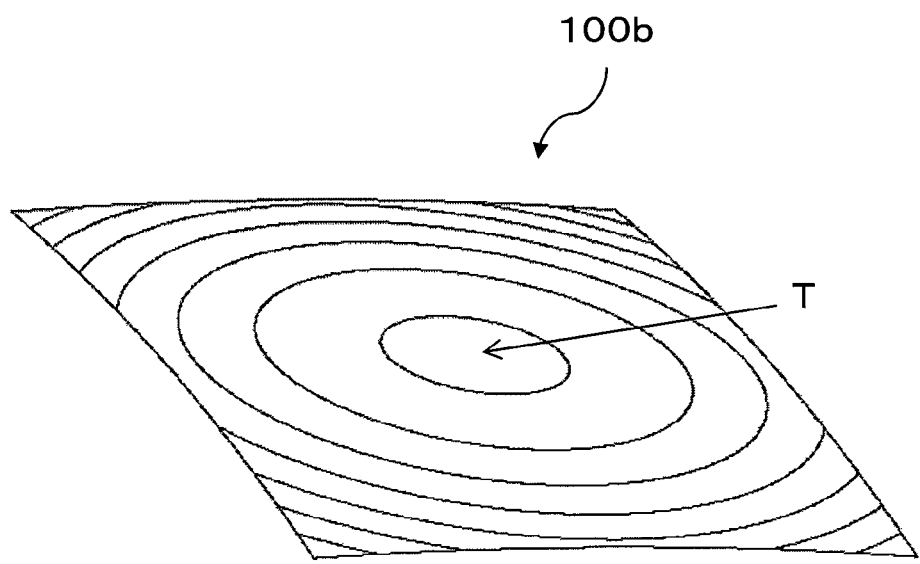
FIG. 3 is a diagram showing a result of a warpage simulation performed on the multilayer wiring board in FIG. 2.

FIG. 3 shows a diagram of the shape of warpage in the simulation result of the board 100b. FIG. 3 shows the board 100b viewed from obliquely above. A plurality of rings in FIG. 3 represent contours. The distance from a plane defined by four vertices of a rectangular board to a center T of the central ring represents the amount of warpage of the board 100b. The amount of warpage (numerical value in the parenthesis in FIG. 3) in the simulation result is the same as the actually measured value 1.21 mm.

<Warpage Simulation No. 2>

Next, a result of a warpage simulation performed on the conventional board 100h shown in FIG. 12 will be described. In the conventional board 100h, base materials having a fiber bundle content of 75% are used for five resin base material layers (B1 to B5). The ratio of copper remaining in the wiring layers is the same as that of the above-described example, that is, 32%, 28%, 37%, 46%, 52%, and 54% in that order starting with the wiring layer C1 shown in FIG. 12. The thickness of each of the wiring layers C (10 μm), the thickness of each of the resin base material layers B (30 μm), and the size of the board (50 mm×50 mm) are the same as those of the above-described example. Also, the physical properties of constituent elements of the board in the warpage simulation are the same as those of the above-described example.

Figure 13:
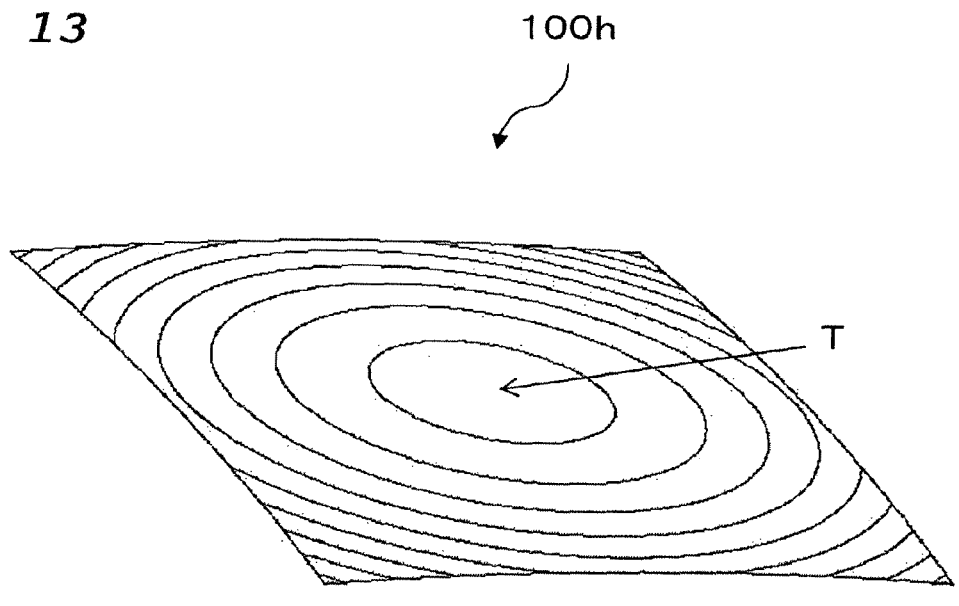
FIG. 13 is a diagram showing a result of a warpage simulation performed on the multilayer wiring board in FIG. 12.

FIG. 13 shows the shape of warpage in the simulation result of the conventional board 100h. The amount of warpage in the simulation is the same as the actually measured value 1.51 mm. Comparison between the result in FIG. 3 and the result in FIG. 13 shows that while the amount of warpage is 1.21 mm in FIG. 3 (the board 100b), it is 1.51 mm in FIG. 13 (the board 100h). Thus, it is seen that the present invention has reduced the warpage by approximately 20%.

In the board 100h shown in FIG. 12 in which the fiber bundle content is uniform throughout all resin base material layers B, warpage at the time of temperature load occurs due to a difference in the amount of thermal expansion resulting from a difference between the ratios of copper remaining in the wiring layers C. In the case of the board 100h, the ratio of copper remaining is 32%, 28%, 37%, 46%, 52%, and 54% in that order starting with the wiring layer C1, that is, the ratio becomes higher toward the lower side. Thus, a force to warp the board 100h to protrude upward acts on the six wiring layers C.

In contrast, the board 100b shown in FIG. 3, the fiber bundle content (63%) of the resin base material layer B4 is different from that (75%) of the other build-up layers, and only the resin base material layer B4 has an amount of thermal expansion larger than that of the other resin base material layers. Thus, a force to warp the board to protrude downward acts on the five resin base material layers B. Accordingly, the force to warp the resin base material layers B to protrude downward acts to cancel the force to warp the wiring layers C to protrude upward, and thus the warpage is reduced.

<Warpage Simulation No. 3>

Figure 4:
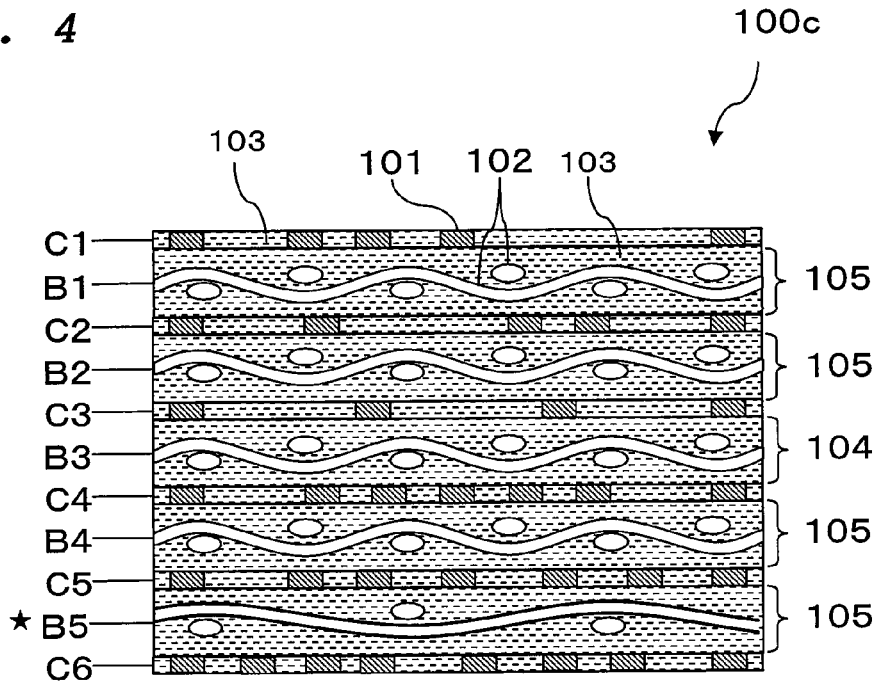
FIG. 4 is a cross-sectional view showing the configuration of another multilayer wiring board according to the embodiment of the present invention.

FIG. 4 shows the configuration of a board 100c. The board 100c has six wiring layers C1 to C6 arranged in that order from above and five resin base material layers that are arranged between the wiring layers C, the resin base material layers comprising layers B1 and B2 (both are the build-up layers 105), B3 (the base layer 104), and B4 and B5 (both are the build-up layers 105) arranged in that order from above. The ratio of copper remaining in the wiring layers C is 32%, 28%, 37%, 46%, 52%, and 54% in that order starting with the wiring layer C1. The arrangement and configuration of these layers are the same as those of the board 100b described above.

In the board 100c in FIG. 4, base materials having a fiber bundle content of 75% are used for the resin base material layers B1, B2, B3, and B4, and a base material having a fiber bundle content of 63% is used only for the outermost resin base material layer B5 (indicated by the symbol * in FIG. 4) positioned on the lower side.

The remaining portion of the configuration, that is, the thickness of each of the wiring layers C, the thickness of each of the resin base material layers B, and the size of the board are the same as those of the board 100b. Also, the physical properties of constituent elements of the board in the warpage simulation are the same as those of the above-described example.

Figure 5:
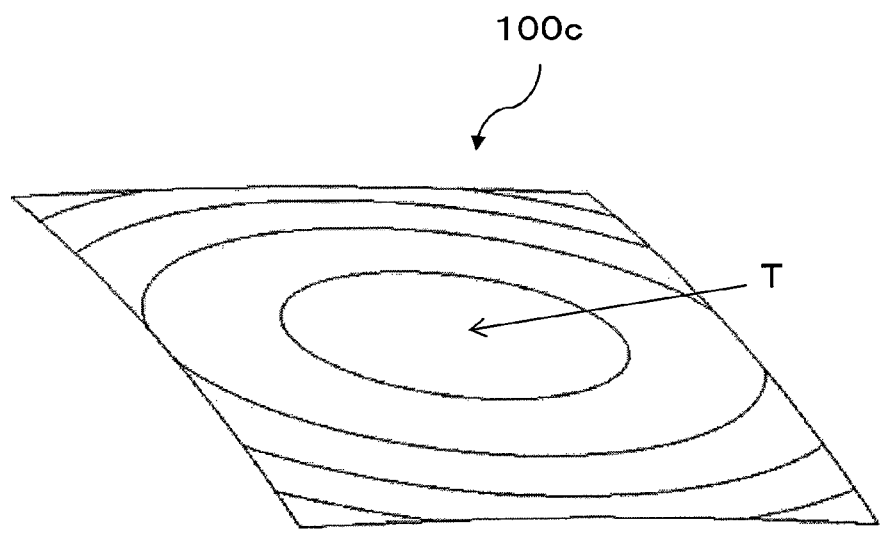
FIG. 5 is a diagram showing a result of a warpage simulation performed on the multilayer wiring board in FIG. 4.

FIG. 5 shows a result of a warpage simulation under a load of the maximum temperature 260° C. in a reflow process. Comparison between the result in FIG. 5 and the result in FIG. 13 shows that while the amount of warpage is 0.84 mm in FIG. 5 (the board 100c), it is 1.51 mm in FIG. 13 (the board 100h). Thus, it is seen that the present invention has reduced the warpage by approximately 44%.

In the board 100c shown in FIG. 4, the fiber bundle content (63%) of the resin base material layer B5 is different from that (75%) of the other build-up layers, and only the resin base material layer B5 has an amount of thermal expansion larger than that of the other resin base material layers. Thus, a force to warp the board 100c to protrude downward acts on the five resin base material layers B. Accordingly, the force to warp the resin base material layers B to protrude downward acts to cancel the force to warp the wiring layers C to protrude upward, and thus the warpage is reduced.

In both the boards 100c and 100b, a resin base material layer having a different fiber bundle content is disposed in resin base material layers (B4 and B5) situated below the base layer 104. However, the board 100c has a larger effect to reduce warpage of the board than the board 100b. The reason for this is based on the arrangement of the resin base material layers. If a resin base material layer having a different fiber bundle content is disposed in the outermost layer, the largest effect can be achieved.

<Warpage Simulation No. 4>

Figure 6:
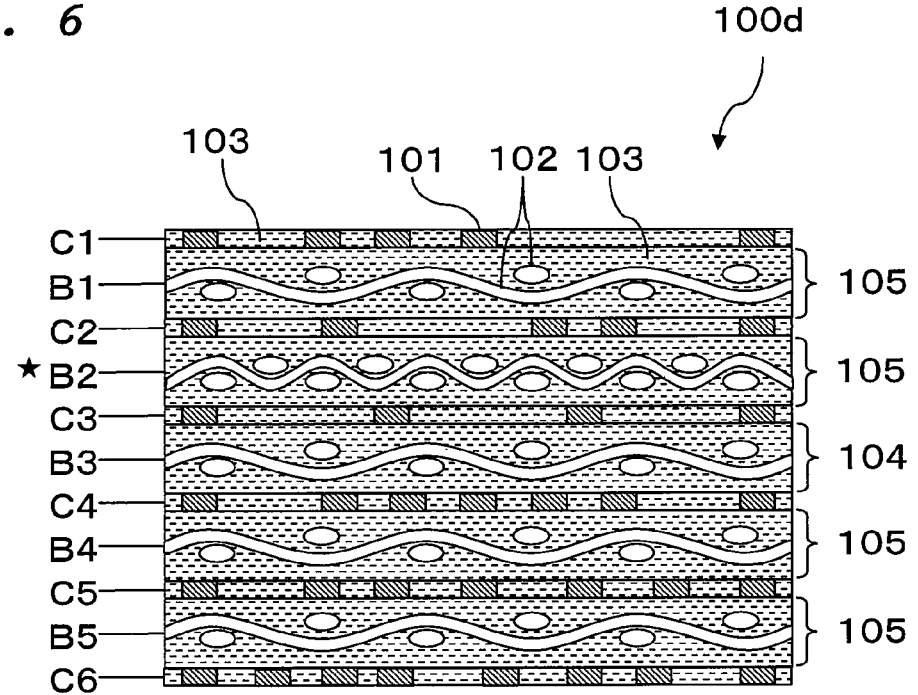
FIG. 6 is a cross-sectional view showing the configuration of another multilayer wiring board according to the embodiment of the present invention.

FIG. 6 shows the configuration of a board 100d. The board 100d has six wiring layers C1 to C6 arranged in that order from above and five resin base material layers that are arranged between the wiring layers, the resin base material layers comprising layers B1 and B2 (both are the build-up layers 105), B3 (the base layer 104), and B4 and B5 (both are the build-up layers 105) arranged in that order from above. The ratio of copper remaining in the wiring layers is 32%, 28%, 37%, 46%, 52%, and 54% in that order starting with the wiring layer C1. The arrangement and configuration of these layers are the same as those of the board 100b described above.

In the board 100d in FIG. 6, base materials having a fiber bundle content of 75% are used for the resin base material layers B1, B3, B4, and B5, and a base material having a fiber bundle content of 81% is used only for the resin base material layer B2 (indicated by the symbol * in FIG. 6) positioned above the base layer 104.

The remaining portion of the configuration, that is, the thickness of each of the wiring layers C, the thickness of each of the resin base material layers B, and the size of the board are the same as those of the board 100b. Also, the physical properties of constituent elements of the board in the warpage simulation are the same as those of the above-described example.

Figure 7:
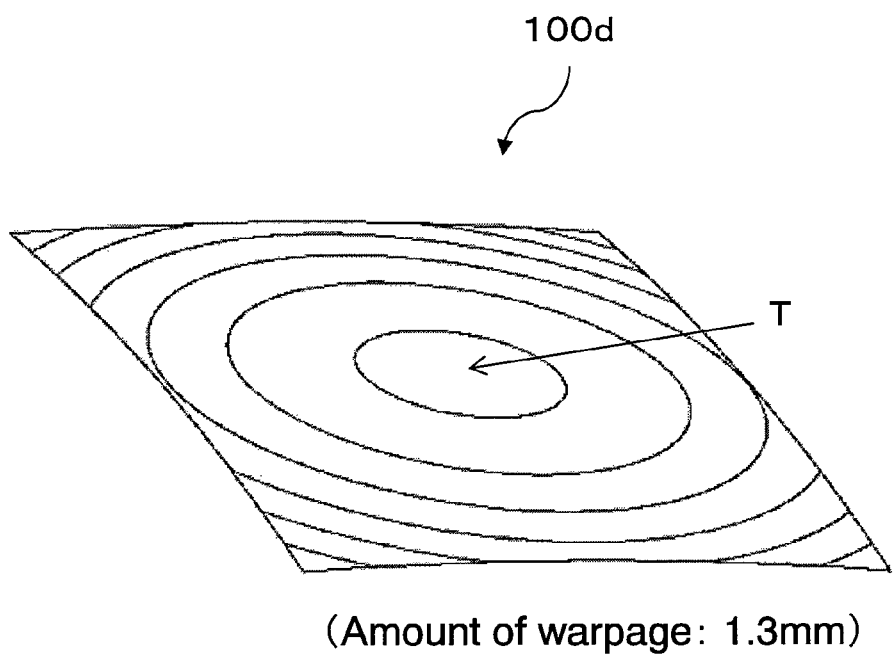
FIG. 7 is a diagram showing a result of a warpage simulation performed on the multilayer wiring board in FIG. 6.

FIG. 7 shows a result of a warpage simulation under a load of the maximum temperature 260° C. in a reflow process. Comparison between the result in FIG. 7 and the result in FIG. 13 shows that while the amount of warpage is 1.30 mm in FIG. 7 (the board 100d), it is 1.51 mm in FIG. 13 (the board 100h). Thus, it is seen that the present invention has reduced the warpage by approximately 13%.

In the board 100d shown in FIG. 7, the fiber bundle content (81%) of the resin base material layer B2 is different from that (75%) of the other build-up layers, and only the resin base material layer B2 has an amount of thermal expansion smaller than that of the other resin base material layers. Thus, a force to warp the board to protrude downward acts on the five resin base material layers B. Accordingly, the force to warp the resin base material layers B to protrude downward acts to cancel the force to warp the wiring layers C to protrude upward, and thus the warpage is reduced.

<Warpage Simulation No. 5>

Figure 8:
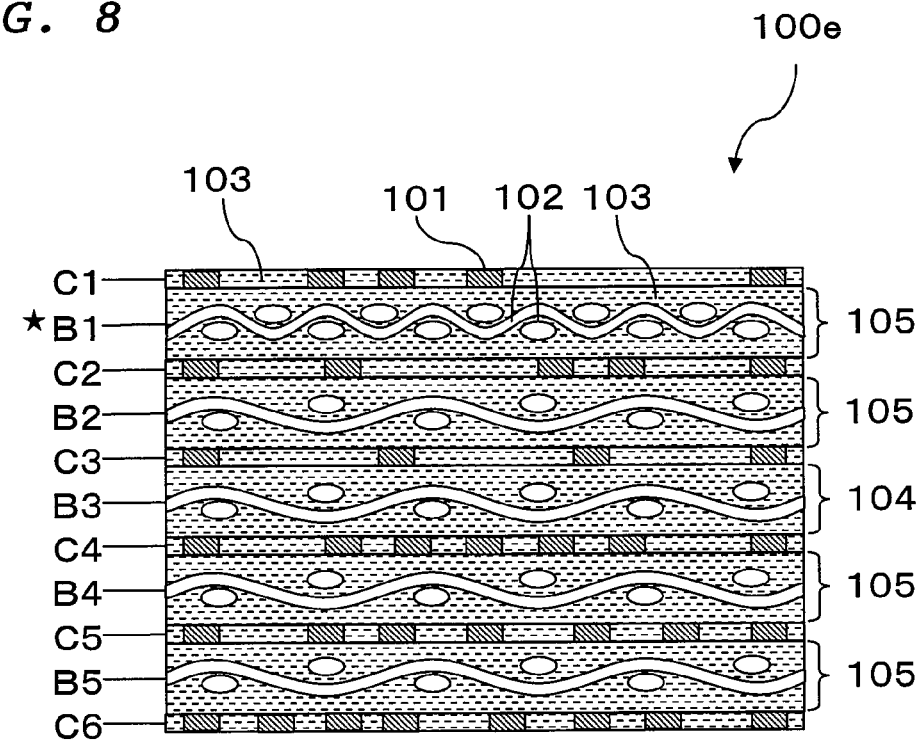
FIG. 8 is a cross-sectional view showing the configuration of another multilayer wiring board according to the embodiment of the present invention.

FIG. 8 shows the configuration of a board 100e. The board 100e has six wiring layers C1 to C6 arranged in that order from above and five resin base material layers that are arranged between the wiring layers, the resin base material layers comprising layers B1 and B2 (both are the build-up layers 105), B3 (the base layer 104), and B4 and B5 (both are the build-up layers 105) arranged in that order from above. The ratio of copper remaining in the wiring layers C is 32%, 28%, 37%, 46%, 52%, and 54% in that order starting with the wiring layer C1. The arrangement and configuration of these layers are the same as those of the board 100b described above.

In the board 100e in FIG. 8, base materials having a fiber bundle content of 75% are used for the resin base material layers B2, B3, B4, and B5, and a base material having a fiber bundle content of 81% is used only for the outermost resin base material layer B1 (indicated by the symbol * in FIG. 8) positioned on the upper side.

The remaining portion of the configuration, that is, the thickness of each of the wiring layers C, the thickness of each of the resin base material layers B, and the size of the board are the same as those of the board 100b. Also, the physical properties of constituent elements of the board in the warpage simulation are the same as those of the above-described example.

Figure 9:
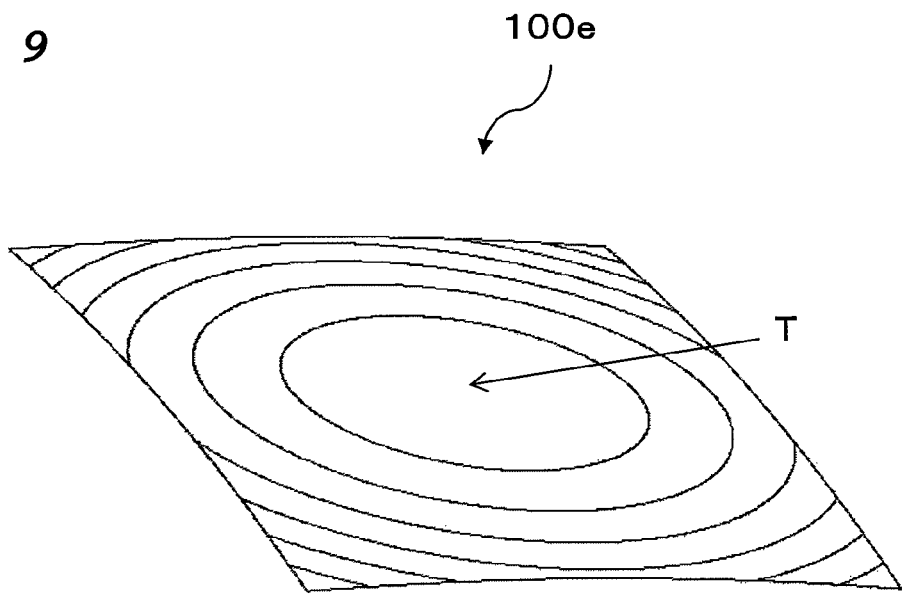
FIG. 9 is a diagram showing a result of a warpage simulation performed on the multilayer wiring board in FIG. 8.

FIG. 9 shows a result of a warpage simulation under a load of the maximum temperature 260° C. in a reflow process. Comparison between the result in FIG. 9 and the result in FIG. 13 shows that while the amount of warpage is 1.19 mm in FIG. 9 (the board 100e), it is 1.51 mm in FIG. 13 (the board 100h). Thus, it is seen that the present invention has reduced the warpage by approximately 21%.

In the board 100e shown in FIG. 8, the fiber bundle content (81%) of the resin base material layer B1 is different from that (75%) of the other build-up layers, and only the resin base material layer B1 has an amount of thermal expansion smaller than that of the other resin base material layers. Thus, a force to warp the board to protrude downward acts on the five resin base material layers B. Accordingly, the force to warp the resin base material layers B to protrude downward acts to cancel the force to warp the wiring layers C to protrude upward, and thus the warpage is reduced.

The board 100e has a larger effect to reduce warpage of the board than the board 100d. The reason for this is based on the arrangement of the resin base material layers as described in Simulation No. 3. If a resin base material layer having a different fiber bundle content is disposed in the outermost layer, the largest effect can be achieved.

Table 1 is a list of the results of Warpage Simulation Nos. 1 to 5. The columns of the table show the ratio of copper remaining (%) in the wiring layers (C1 to C6) of the board, the fiber bundle content (%) of the resin base material layers (B1 to B5), and the warpage level, for each simulation No.

TABLE 1

| Simulation | ratio of copper remaining (%) in wiring layer C, or fiber bundle content (%) of resin base material layer B | | | | | | | | | | | amount of warpage |
|---|---|---|---|---|---|---|---|---|---|---|---|---|
| No. | C1 | B1 | C2 | B2 | C3 | B3 | C4 | B4 | C5 | B5 | C6 | (mm) |
| 1 | 32 | 75 | 28 | 75 | 37 | 75 | 46 | 63 | 52 | 75 | 54 | 1.21 |
| 3 | 32 | 75 | 28 | 75 | 37 | 75 | 46 | 75 | 52 | 63 | 54 | 0.84 |
| 4 | 32 | 75 | 28 | 81 | 37 | 75 | 46 | 75 | 52 | 75 | 54 | 1.3 |
| 5 | 32 | 81 | 28 | 75 | 37 | 75 | 46 | 75 | 52 | 75 | 54 | 1.19 |
| 2 (Com.Ex.) | 32 | 75 | 28 | 75 | 37 | 75 | 46 | 75 | 52 | 75 | 54 | 1.51 |

As described above, as methods for reducing warpage of the board, the following methods are conceivable: a method in which as at least one of resin base material layers, a resin base material layer having a smaller fiber bundle content than that of the other resin base material layers is used (Simulation Nos. 1 and 3); and a method in which as at least one of resin base material layers, a resin base material layer having a larger fiber bundle content than that of the other build-up layers is used (Simulation Nos. 4 and 5). As clearly seen from the results of the warpage simulations, each of these methods can reduce warpage of the board, by generating a force to warp the resin base material layers B to protrude downward against a force to warp the wiring layers C of the board to protrude upward.

Figure 10:
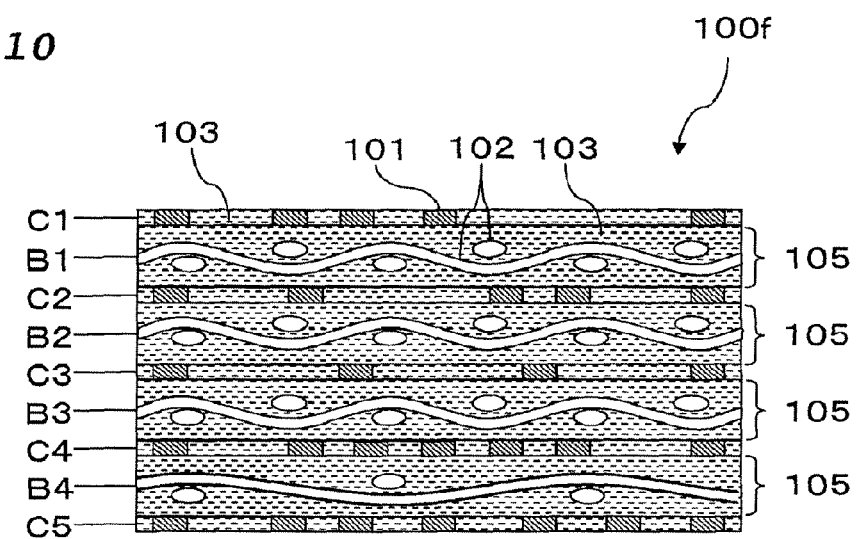
FIG. 10 is a cross-sectional view showing the configuration of another multilayer wiring board according to the embodiment of the present invention.

In this embodiment, the board having five resin base material layers was described, but the present invention is not limited to this. Furthermore, in this embodiment, the case in which the base layer 104 is present in the center of the board, that is, the case in which there are an even number of wiring layers was described, but the present invention is not limited to this. According to the present invention, an effect similar to that of the foregoing embodiment can be exerted also in a case where as shown in FIG. 10, the base layer 104 is not present at the center of the board, and a board 100f is constituted only by the build-up layers 105, that is, there are an odd number of wiring layers.

For example, in a case where the average of the ratio of copper remaining in wiring layers situated on the lower side in the board excluding a wiring layer present at the center of the board is larger than that in wiring layers situated on the upper side, warpage of the board can be reduced by either one of the following methods.

(1) In at least one of the build-up layers 105 situated on the lower side in the board, a resin base material layer having a smaller fiber bundle content than that of the other build-up layers 105 is used.

(2) In at least one of the build-up layers 105 situated on the upper side in the board, a resin base material layer having a larger fiber bundle content than that of the other build-up layers 105 is used.

Furthermore, in this embodiment, the case was described in which the fiber bundle content of one resin base material layer was made different from that of the resin base material layers other than that layer, but the present invention is not limited to this. The present invention is applicable also to the case in which the fiber bundle content of two or more resin base material layers is made different from that of the resin base material layers other than those layers.

The multilayer wiring board of the present invention can be used in many applications as wiring boards mounted for forming electronic circuits, such as portable electronic devices and digital mobile products.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A multilayer wiring board comprising n (n is an integer of at least 4) wiring layers including an insulating resin and a wire made of a conductive material, and (n−1) resin base material layers including an insulating resin and a fiber bundle impregnated with said insulating resin, said n wiring layers and said (n−1) resin base material layers being laminated in an alternately layered manner, wherein at least one of said (n−1) resin base material layers has a fiber bundle content different from that of a rest of said (n−1) resin base material layers, and wherein said n wiring layers are stacked so that a first wiring layer to a $n^{th}$ wiring layer are stacked in this order and the (n−1) resin base material layers are stacked so that a first resin base material layer to a $(n-1)^{th}$ resin base material layer are stacked in this order, the first wiring layer is adjacent to the first resin base material layer and the $n^{th}$ wiring layer is adjacent to the $(n-1)^{th}$ resin base material layer.

2. The multilayer wiring board in accordance with claim 1, wherein n is an even number, taking the $n/2^{th}$ resin base material layer of said (n−1) resin base material layers as a boundary, an average of a ratio of copper remaining in the first wiring layer to the $(n/2)^{th}$ wiring layer of said n wiring layers from one mounting face is larger than that in the $(n/2+1)^{th}$ wiring layer to the $n^{th}$ wiring layer of said n wiring layers, and at least one of the first resin base material layer to the $(n/2-1)^{th}$ resin base material layer of said (n−1) resin base material layers has a fiber bundle content smaller than that of the rest of said (n−1) resin base material layers.

3. The multilayer wiring board in accordance with claim 2, wherein the first resin base material layer has a fiber bundle content smaller than that of the rest of said (n−1) resin base material layers.

4. The multilayer wiring board in accordance with claim 1, wherein n is an odd number, taking the $(n+1)/2^{th}$ wiring layer of said n wiring layers as a boundary, an average of a ratio of copper remaining in the first to the $(n-1)/2^{th}$ wiring layer of said n wiring layers from one mounting face is larger than that in the $(n+3)/2^{th}$ wiring layer to the $n^{th}$ wiring layer of said n wiring layers, and at least one of the first resin base material layer to the $(n-1)/2^{th}$ resin base material layer of said (n−1) resin base material layers has a fiber bundle content smaller than that of the rest of said resin base material layers.

5. The multilayer wiring board in accordance with claim 1, wherein n is an even number, taking the $n/2^{th}$ resin base material layer of said (n−1) resin base material layers as a boundary, an average of a ratio of copper remaining in the first wiring layer to the $(n/2)^{th}$ wiring layer of said n wiring layers from one mounting face is smaller than that in the $(n/2+1)^{th}$ wiring layer to the $n^{th}$ wiring layer of said n wiring layers, and at least one of the first resin base material layer to the $(n/2-1)^{th}$ resin base material layer of said (n−1) resin base material layers has a fiber bundle content larger than that of the rest of said resin base material layers.

6. The multilayer wiring board in accordance with claim 5, wherein the first resin base material layer has a fiber bundle content larger than that of the rest of said resin base material layers.

7. The multilayer wiring board in accordance with claim 1, wherein n is an odd number, taking the $(n+1)/2^{th}$ wiring layer of said n wiring layers as a boundary, an average of a ratio of copper remaining in the first wiring layer to the $(n-1)/2^{th}$ wiring layer of said n wiring layers from one mounting face is smaller than that in the $(n+3)/2^{th}$ wiring layer to the $n^{th}$ wiring layer of said n wiring layers, and at least one of the first resin base material layer to the $(n-1)/2^{th}$ resin base material layer of said (n−1) resin base material layers has a fiber bundle content larger than that of the rest of said resin base material layers.

* * * * *